United States Patent
Chiou et al.

[11] Patent Number: 5,873,769
[45] Date of Patent: Feb. 23, 1999

[54] TEMPERATURE COMPENSATED CHEMICAL MECHANICAL POLISHING TO ACHIEVE UNIFORM REMOVAL RATES

[75] Inventors: Hung-Wen Chiou, Hsinchu; Lai-Juh Chen, Hsin-chu, both of Taiwan

[73] Assignee: Industrial Technology Research Institute, Hsin-Chu, Taiwan

[21] Appl. No.: 866,797

[22] Filed: May 30, 1997

[51] Int. Cl.⁶ .................... B24B 49/00; B24B 1/00
[52] U.S. Cl. .................... 451/7; 451/36; 451/41; 451/53; 451/287; 451/398
[58] Field of Search ................... 451/41, 63, 286, 451/287, 288, 289, 290, 398, 5, 7, 36, 53, 60, 385, 446; 216/88, 89; 364/474.06; 438/692, 693

[56] References Cited

U.S. PATENT DOCUMENTS

| | | | |
|---|---|---|---|
| 3,571,978 | 3/1971 | Day et al. | 451/7 X |
| 4,471,579 | 9/1984 | Bovensiepen | 451/7 |
| 4,910,155 | 3/1990 | Cote et al. . | |
| 5,036,630 | 8/1991 | Kaanta et al. | 451/41 |
| 5,196,353 | 3/1993 | Sandhu et al. . | |
| 5,422,316 | 6/1995 | Desai et al. . | |
| 5,486,129 | 1/1996 | Sandhu et al. . | |
| 5,605,488 | 2/1997 | Ohashi et al. | 451/7 |
| 5,690,540 | 11/1997 | Elliot et al. | 451/288 X |
| 5,716,264 | 2/1998 | Kimura et al. | 451/288 X |
| 5,718,620 | 2/1998 | Tanaka et al. | 451/449 X |
| 5,762,539 | 6/1998 | Nakahiba et al. | 451/288 X |

*Primary Examiner*—Timothy V. Eley
*Attorney, Agent, or Firm*—George O. Saile; Stephen B. Ackerman; Larry J. Prescott

[57] ABSTRACT

A method and apparatus are described for Chemical Mechanical Polishing of wafers which achieves a constant removal rate of material from the wafer over the entire surface of the wafer. The wafer is held in a wafer carrier rotating at a wafer carrier angular velocity and is polished using a platen rotating at a platen angular velocity. The pressure exerted on the wafer by the wafer carrier is the largest at the wafer edge and smallest at the center of the wafer. The wafer carrier is divided into a number of wafer carrier circular segments so that the temperature of each wafer carrier circular segment can be controlled. The platen is divided into a number of platen circular segments so that the temperature of each platen circular segment can be controlled. The temperatures of the wafer carrier circular segments and the platen circular segments are then adjusted to provide a removal rate of material from the wafer which is uniform across the surface of the wafer.

17 Claims, 7 Drawing Sheets

FIG. 11 ured on the wafer by the wafer carrier 12, and
TEMPERATURE COMPENSATED CHEMICAL MECHANICAL POLISHING TO ACHIEVE UNIFORM REMOVAL RATES

BACKGROUND OF THE INVENTION (1) Field of the Invention

This invention relates to removing material from the surface of a wafer using Chemical Mechanical Polishing and more particularly to the use of temperature compensation to achieve uniform removal rates across the entire surface of the wafer.

(2) Description of the Related Art

Chemical Mechanical Polishing, CMP, is frequently used to planarize wafers by removing material from the surface of a wafer. CMP uses a rotating wafer carrier to hold a wafer against a polishing pad held by a rotating platen. The polishing also uses a polishing slurry dispensed on the polishing pad.

U.S. Pat. No. 5,196,353 to Sandhu et al. describes a method and apparatus for thermally mapping the surface of a wafer during Chemical Mechanical Polishing. The thermal map information is then analyzed and used to modify the polishing process parameters.

U.S. Pat. No. 5,486,129 to Sandhu et al. describes a system and method for Chemical Mechanical Polishing wafers using a polish control subsystem and a polishing head with localized pressure applicators for controlling localized pressure at individual regions of the wafer. The polish control subsystem allows control of operational subsystems such as temperature at the wafer surface, platen velocity, and localized pressure.

U.S. Pat. No. 4,910,155 to Cote et al. describes a method for Chemical Mechanical Polishing insulators, such as silicon oxide and silicon nitride, formed on the surface of wafers. The method uses a slurry with particulates having a hardness commensurate to the hardness of the insulator to be polished at a temperature between 85° F. and 95° F. to maximize both polishing pad lifetime and planarization uniformity.

U.S. Pat. No. 5,422,316 to Desai et al. describes a Chemical Mechanical Polishing system for polishing wafers which uses a polishing limiter to limit the reduction in thickness of the wafer during polishing.

This invention describes a method and apparatus for achieving a uniform material removal rate across the entire surface of the wafer. The temperature of circular segments of the wafer carrier and circular segments of the platen are individually controlled. The temperature of the wafer carrier circular segments and platen circular segments are individually controlled to compensate for pressure variation across the wafer and variation of the relative velocity between the wafer and platen across the wafer to produce a uniform material removal rate across the entire surface of the wafer.

SUMMARY OF THE INVENTION

Chemical Mechanical Polishing, CMP, is becoming increasingly more important as a means to planarize wafers between steps of depositing metal or dielectric layers on the wafer. It is important that the removal rate of material from a wafer be uniform over the entire surface of the wafer. Chemical Mechanical Polishing is typically carried out using a platen 10 rotating at a first angular velocity, $\omega_p$, see FIG. 1. A wafer is held in a wafer carrier 12 rotating at a second angular velocity, $\omega_c$, and positioned above the rotating platen 10. Slurry is supplied from a slurry supply 34, through a slurry supply tube 32, and through a nozzle 30 onto the platen 10. The center of the wafer carrier 12 is a first distance 20 from the center of the platen. The radius 22 of the wafer carrier 12 is a second distance. The rate at which material is removed from a wafer element 14 is proportional to the temperature of the wafer element 14, the pressure exerted on the wafer element 14 by the wafer carrier 12, and the magnitude of the relative velocity between the wafer element 14 and the platen 10. The wafer element 14 has a radial distance r 18 from the center of the wafer carrier and a position angle θ 16 from a base line 24 connecting the center of the platen and the center of the wafer carrier.

Figure 2:
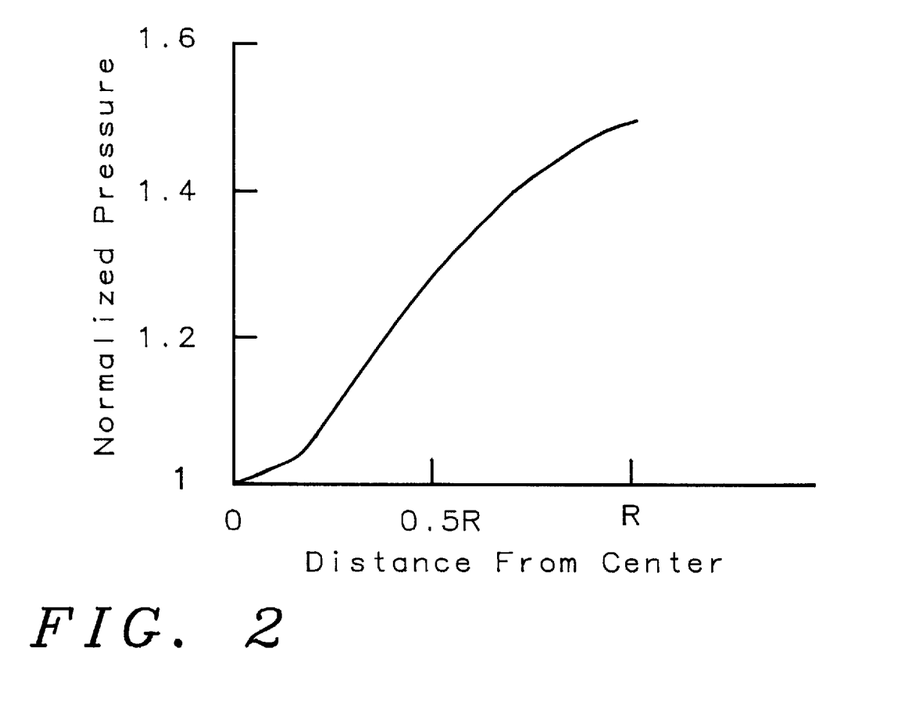
FIG. 2 shows a curve of the variation of the normalized pressure exerted on the wafer by the wafer carrier as a function of distance from the center of the wafer carrier.

The ideal situation is to have the removal rate of material from the wafer be constant for all values of the radial distance 18 and position angle 16. However, The pressure exerted on the wafer by the wafer carrier 12 is not constant but is smallest at the center of the wafer carrier and increases to a maximum at the edge of the wafer carrier. FIG. 2 shows the normalized pressure exerted on the wafer by the wafer carrier as a function of distance from the center of the wafer carrier. The magnitude of the relative velocity between the wafer element 14 at a radial distance 18, r, from the center of the wafer carrier and a position angle 16, θ, from the base line 24 connecting the center of the platen and the center of the wafer carrier and the platen 10 is not constant over all positions of the wafer carrier but varies with both the radial distance 18 and the position angle 16.

This positional variation of both the magnitude of the relative velocity between the platen and the wafer element and the pressure exerted on the wafer by the wafer carrier makes it very difficult to achieve the ideal case of a constant removal rate of material from the surface of the wafer for all positions on the wafer carrier.

It is a principle objective of this invention to provide a method of Chemical Mechanical Polishing wafers which achieves a constant removal rate of material from the surface of the wafer for all positions on the wafer carrier.

It is another principle objective of this invention to provide an apparatus for Chemical Mechanical Polishing wafers which achieves a constant removal rate of material from the surface of the wafer for all positions on the wafer carrier.

These objectives are achieved by controlling the temperature of circular segments of the wafer carrier forming annular rings concentric with the center of the wafer carrier and circular segments of the platen forming annular rings concentric with the center of the platen. The temperature of the wafer carrier circular segments and the temperature of the platen circular segments are adjusted to provide a constant removal rate of material from the surface of the wafer for all positions on the wafer carrier.

DESCRIPTION OF THE PREFERRED EMBODIMENTS

The preferred embodiments of the Chemical Mechanical Polishing method and apparatus for achieving a constant removal rate of material from a wafer over the entire surface of the wafer will now be described with reference to FIGS. 1–11.

Figure 1:
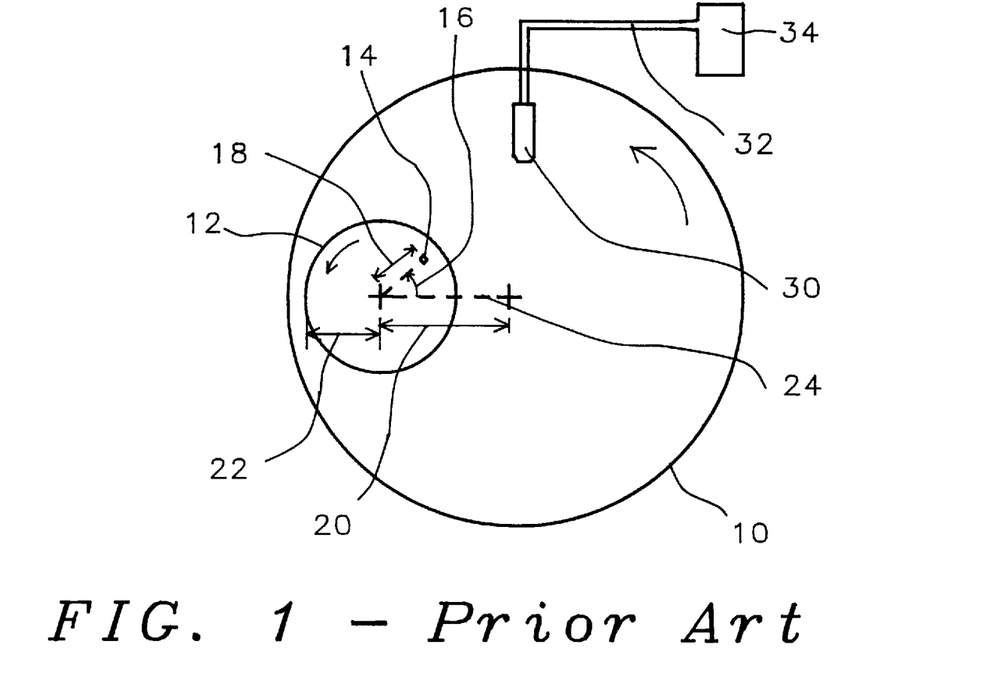
FIG. 1 shows a top view of a conventional Chemical Mechanical Polishing apparatus.

FIG. 1 shows a top view of a Chemical Mechanical Polishing apparatus showing a platen 10 rotating at a platen angular velocity, a wafer carrier 12 rotating at a wafer carrier angular velocity, and a slurry dispensing apparatus comprising a slurry supply 34, a supply tube 32, and a nozzle 30. The diameter 22 of the wafer carrier 12 will be designated R and in this example is between about 3 and 7 inches but can be any diameter appropriate for the wafer being polished. The distance 20 between the center of the platen 10 and the center of the wafer carrier 12 will be designated a and, in this example, is between about 6 inches and 7 inches.

Polishing is accomplished by relative motion between a wafer element 14 and the platen 10. The wafer element is a distance r 18 from the center of the wafer carrier and at a position angle θ 16 from a base line 24 between the center of the wafer carrier and the center of the platen. The magnitude of the relative velocity, $|V_{12}|$, between the wafer element 14 and the platen 10 is given by the following equation:

$$|v_{12}|=[r^2(\omega_p-\omega_c)^2+(\omega_p a)^2-2ar\omega_p(\omega_p-\omega_c)\cos\theta]^{1/2}.$$

In the above equation r is the distance 18 from the wafer element 14 to the center of the wafer carrier, a is the distance 20 between the center of the platen and the center of the wafer carrier, θ is the position angle 16 of the wafer element 14, $\omega_p$ is the angular velocity of the platen, $\omega_c$ is the angular velocity of the wafer carrier, and $|V_{12}|$ is the magnitude of the relative velocity between the wafer element 14 and the platen 10.

It can be seen from the above equation that for the case where the platen angular velocity is equal to the wafer carrier angular velocity the magnitude of the relative velocity between the wafer element 14 and the platen 10 is equal to the platen angular velocity multiplied by the distance between the distance 20 between the center of the platen 10 and the center of the wafer carrier 12 and does not depend on either the position angle 16 or the distance 18 between the wafer element 14 and the center of the wafer carrier 12.

FIG. 2 shows a curve of the normalized pressure between the wafer element and the platen as a function of the distance from the center of the wafer carrier. The normalized pressure is lowest at the center of the wafer carrier, greatest at the edge of the wafer carrier and increases with increasing distance from the center of the wafer carrier.

Figure 3:
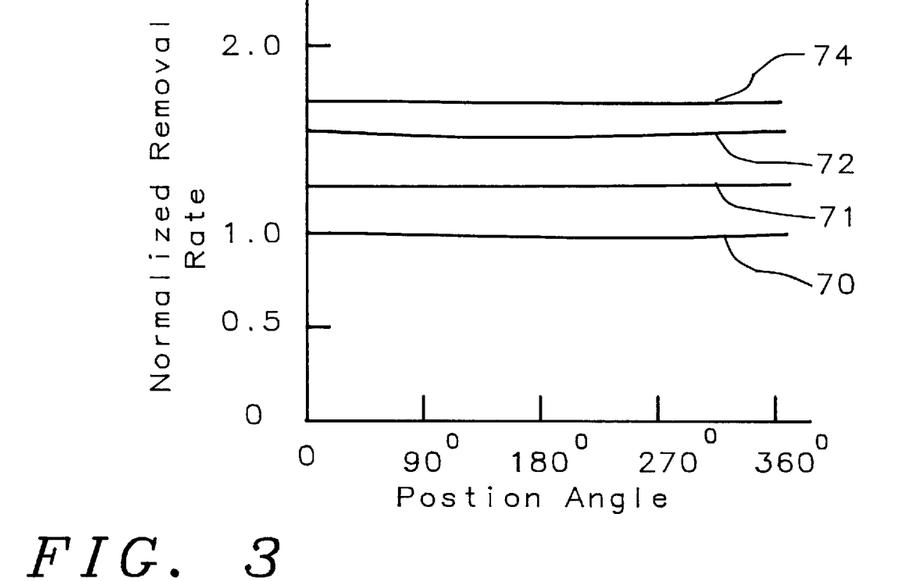
FIG. 3 shows curves of normalized removal rate as a function of position angle for the case where the platen angular velocity is the same as the wafer carrier angular velocity.

FIG. 3 shows the normalized removal rate of wafer material as a function of position angle for the case where the platen angular velocity is equal to the wafer carrier angular velocity. The removal rate of material from the wafer is proportional to the temperature, the pressure exerted on the wafer by the wafer carrier, and the magnitude of the relative velocity between the wafer element and the platen. Curves 70, 71, and 72 show the normalized removal rates of material from the wafer as a function of the position angle with no adjustments to the temperature of either the wafer carrier or the platen. The bottom curve 70 shows the normalized removal rate at the center of the wafer. The second curve from the bottom 71 shows the normalized removal rate at a distance between the center and the edge of the wafer. The third curve from the bottom 72 shows the normalized removal rate at the edge of the wafer.

Figure 4:
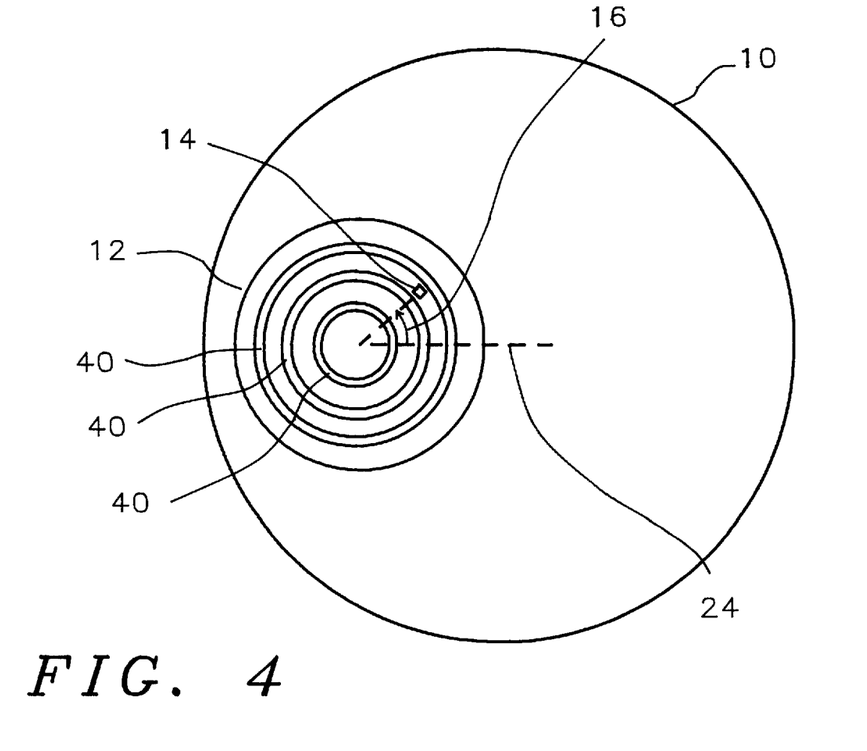
FIG. 4 shows a top view of a Chemical Mechanical Polishing apparatus showing the wafer carrier circular segments with separate temperature control.

As shown in FIG. 4 a number of concentric heating elements 40 are placed in the wafer carrier so that the temperature of circular regions of the wafer carrier, concentric with the center of the wafer carrier, can be independently controlled. The temperatures are adjusted so that the temperature at the center of the wafer carrier is the greatest and decreases with increasing distance from the center of the wafer carrier to the edge of the wafer carrier, which is at the lowest temperature. With this temperature variation the same wafer material removal rate, independent of either distance from the center of the wafer or position angle, can be achieved over the entire wafer surface of the wafer as shown by the top curve 74 in FIG. 3.

Figure 5:
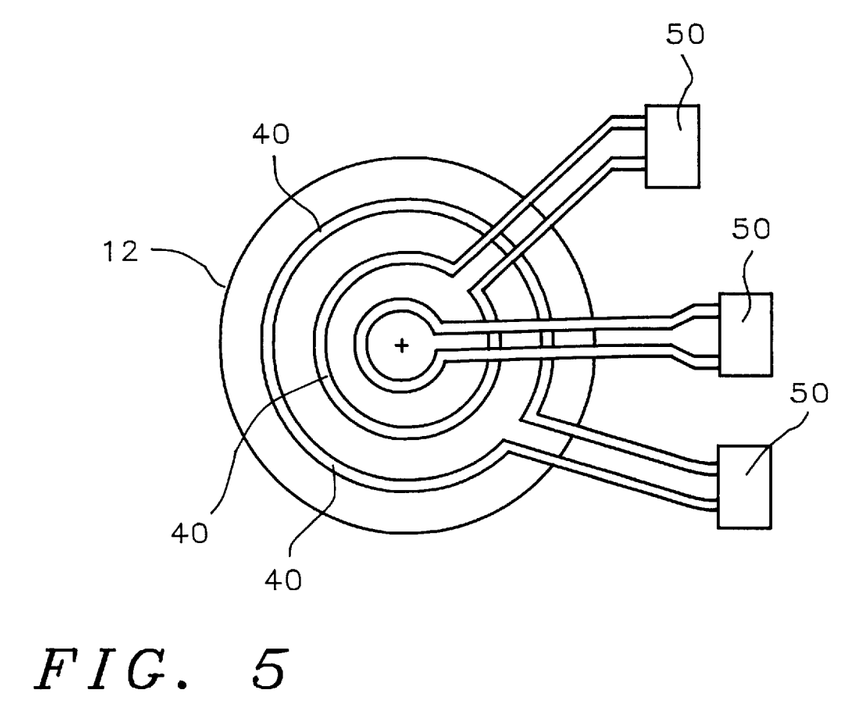
FIG. 5 shows a top view of a wafer carrier with separate temperature control to the wafer carrier circular segments provided by electric power supplied to electrical heating elements or heated or cooled liquid supplied to heating or cooling tubes.

FIG. 5 shows methods and apparatus of heating the concentric heating elements 40 in greater detail. The concentric heating elements 40 can be electric heating elements in the wafer carrier 12 supplied by independent electrical power sources 50. The concentric heating elements 40 can be tubes in the wafer carrier 12 through which heated or cooled liquid from independent sources 50 flows.

Figure 6A:
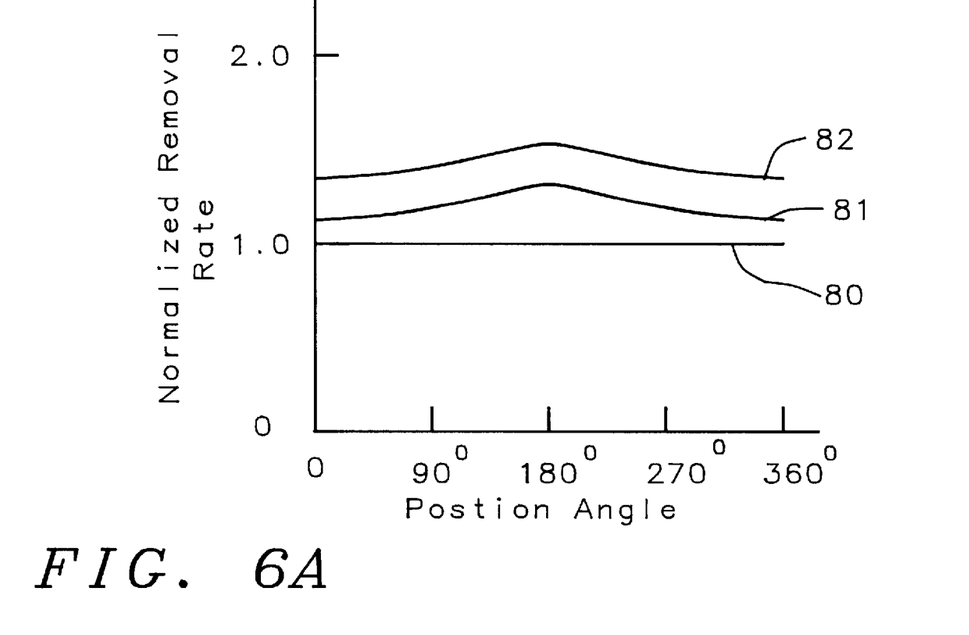
FIG. 6A shows curves of normalized removal rate as a function of position angle for the case where the platen angular velocity is greater than the wafer carrier angular velocity, the wafer carrier circular segments are at the same temperature, and the platen circular segments are at the same temperature.

FIG. 6A shows the normalized removal rate of wafer material as a function of position angle for the case where the platen angular velocity is greater than the wafer carrier angular velocity. Curves 80, 81, and 82 show the normalized removal rates of material from the wafer as a function of the position angle with no adjustments to the temperature of either the wafer carrier or the platen. The bottom curve 80 shows the normalized removal rate at the center of the wafer. The middle curve 81 shows the normalized removal rate at a distance between the center and the edge of the wafer. The top curve 82 shows the normalized removal rate at the edge of the wafer.

As shown in FIGS. 4 and 5 and described above the temperature of circular segments of the wafer carrier can be adjusted. The temperatures are adjusted so that the temperature at the center of the wafer carrier is the greatest and decreases with increasing distance from the center of the wafer carrier to the edge of the wafer carrier, which is at the lowest temperature. The result of this temperature adjustment is that the removal rates at different distances from the center of the wafer are nearly the same but still show a dependence on position angle, as shown in curves 80, 81, and 82 of FIG. 6B.

Figure 8:
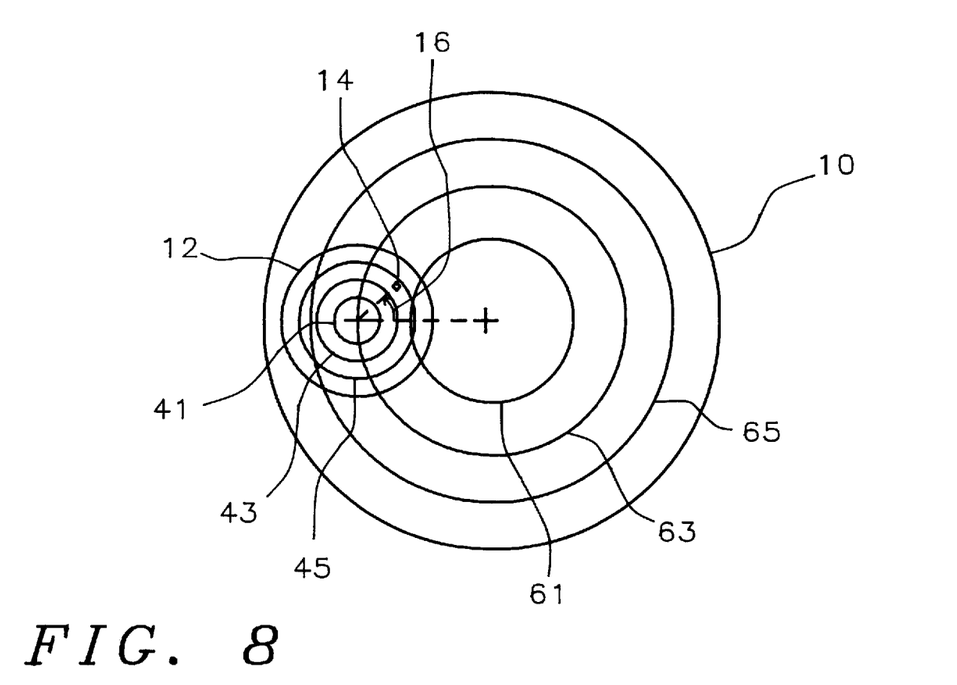
FIG. 8 shows a top view of a Chemical Mechanical Polishing apparatus showing temperature controlled wafer carrier circular segments and temperature controlled platen circular segments.

FIG. 8 shows a diagram of the platen 10 and the wafer carrier 12 showing circular segments, 61, 63, and 65 of the platen and circular segments, 41, 43, and 45 of the wafer carrier. It can be seen from FIG. 8 that the temperature of each circular segment of the platen affects the removal rate for a position angle 16 of θ and 360°−θ. Next the temperature of circular segments of the platen, 61, 63, and 65 are adjusted so that the temperature of the inner circular segment 61 of the platen corresponding to position angle of 0° or 360° is the highest, the temperature of the outer circular segment 65 of the platen is the lowest, and the temperature of the circular segments progress between these extremes in a regular progression.

Figure 6B:
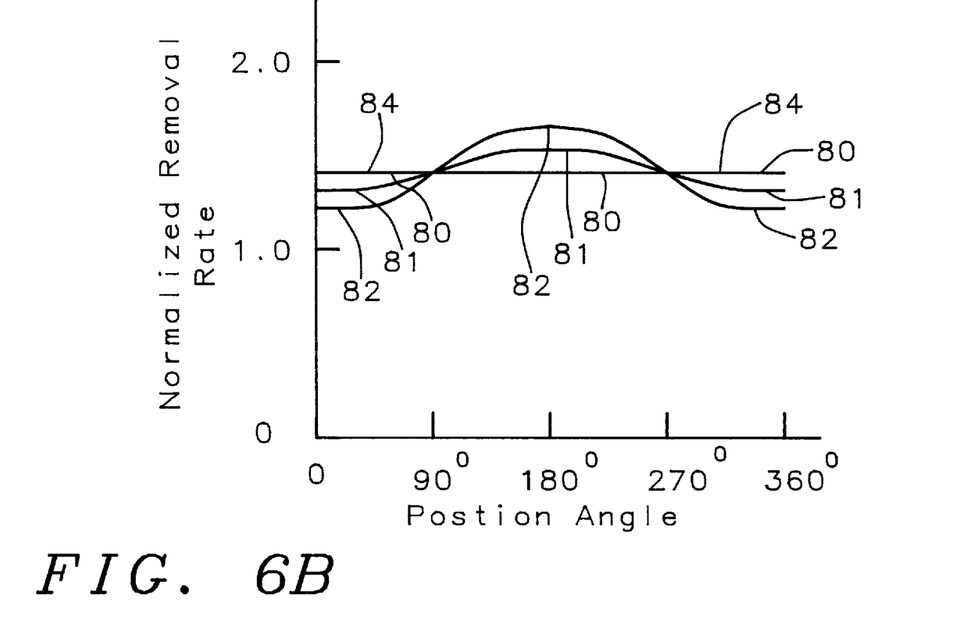
FIG. 6B shows curves of normalized removal rate as a function of position angle for the case where the platen angular velocity is greater than the wafer carrier angular velocity, the temperatures of wafer carrier circular segments are controlled, and the temperatures of the platen circular segments are controlled.

The temperature adjustment of the platen circular segments described above superimposed on the temperature adjustment of the wafer carrier circular segments described above produces a removal rate which is nearly constant over the entire surface of the wafer, as shown by curve 84 in FIG. 6B. The actual variation of the normalized removal rate of material from the wafer is less than about 4% from the highest removal rate to the lowest removal rate.

Figure 7A:
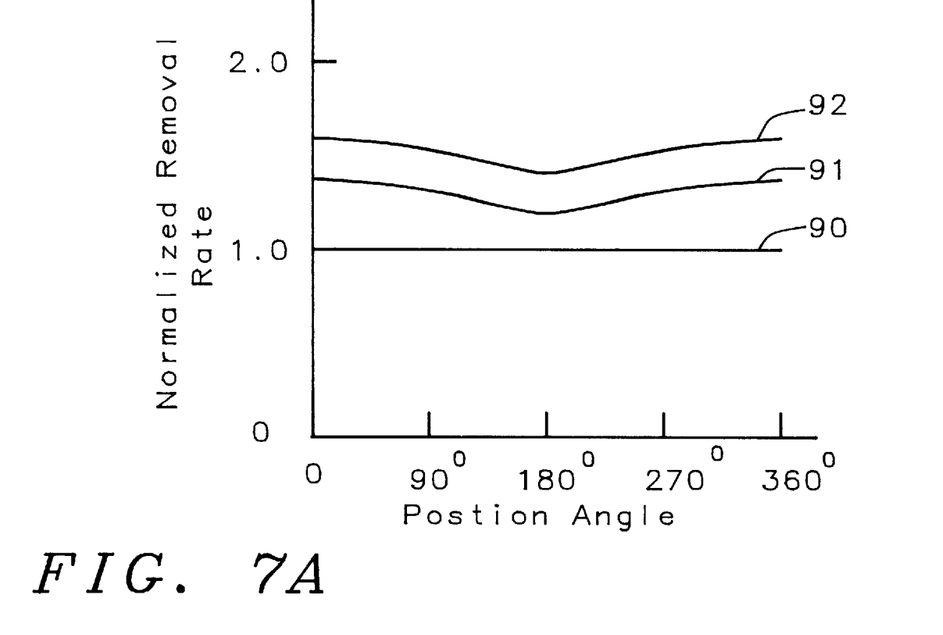
FIG. 7A shows curves of normalized removal rate as a function of position angle for the case where the platen angular velocity is less than the wafer carrier angular velocity, the wafer carrier circular segments are at the same temperature, and the platen circular segments are at the same temperature.

FIG. 7A shows the normalized removal rate of wafer material as a function of position angle for the case where the platen angular velocity is less than the wafer carrier angular velocity. Curves 90, 91, and 92 show the normalized removal rates of material from the wafer as a function of the position angle with no adjustments to the temperature of either the wafer carrier or the platen. The bottom curve 90 shows the normalized removal rate at the center of the wafer. The middle curve 91 shows the normalized removal rate at a distance between the center and the edge of the wafer. The top curve 92 shows the normalized removal rate at the edge of the wafer.

As shown in FIGS. 4 and 5 and described above the temperature of circular segments of the wafer carrier can be adjusted. The temperatures are adjusted so that the temperature at the center of the wafer carrier is the greatest and decreases with increasing distance from the center of the wafer carrier to the edge of the wafer carrier, which is at the lowest temperature. The result of this temperature adjustment is that the removal rates at different distances from the center of the wafer are nearly the same but still show a dependence on position angle, as shown in curves 90, 91, and 92 of FIG. 7B.

FIG. 8 shows a diagram of the platen 10 and the wafer carrier 12 showing circular segments, 61, 63, and 65 of the platen and circular segments, 41, 43, and 45 of the wafer carrier. It can be seen from FIG. 8 that the temperature of each circular segment of the platen affects the removal rate for a position angle 16 of θ and 360°−θ. Next the temperature of circular segments of the platen, 61, 63, and 65 are adjusted so that the temperature of the inner circular segment 61 of the platen corresponding to position angle of 0° or 360° is the lowest, the temperature of the outer circular segment 65 of the platen is the highest, and the temperature of the circular segments progress between these extremes in a regular progression.

Figure 7B:
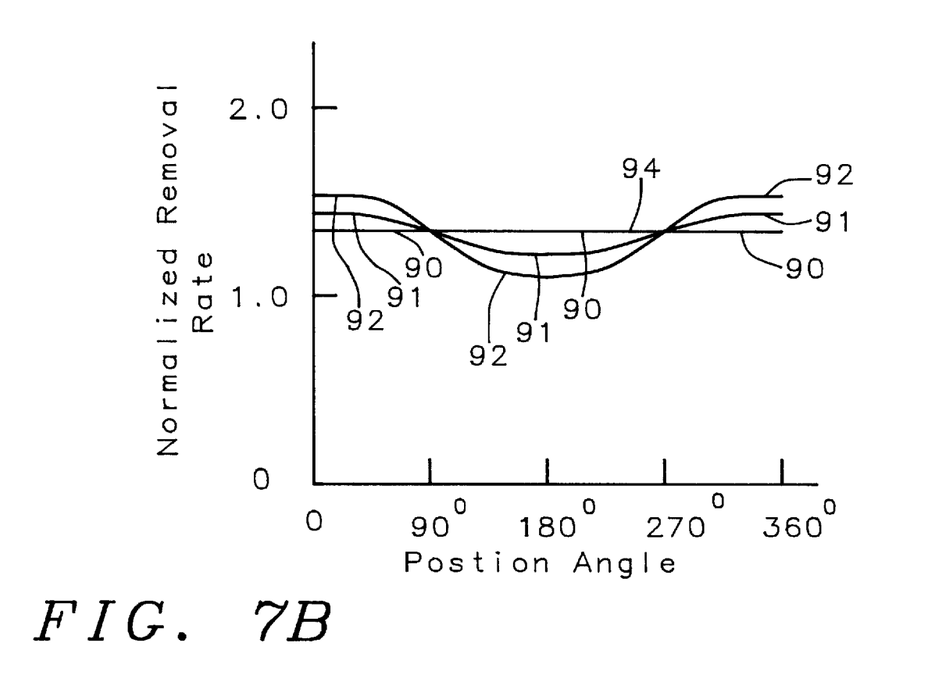
FIG. 7B shows curves of normalized removal rate as a function of position angle for the case where the platen angular velocity is less than the wafer carrier angular velocity, the temperatures of wafer carrier circular segments are controlled, and the temperatures of the platen circular segments are controlled.

The temperature adjustment of the platen circular segments described above superimposed on the temperature adjustment of the wafer carrier circular segments described above produces a removal rate which is nearly constant over the entire surface of the wafer, as shown by curve 94 in FIG. 7B. The actual variation of the normalized removal rate of material from the wafer is less than about 4% from the highest removal rate to the lowest removal rate.

Figure 9:
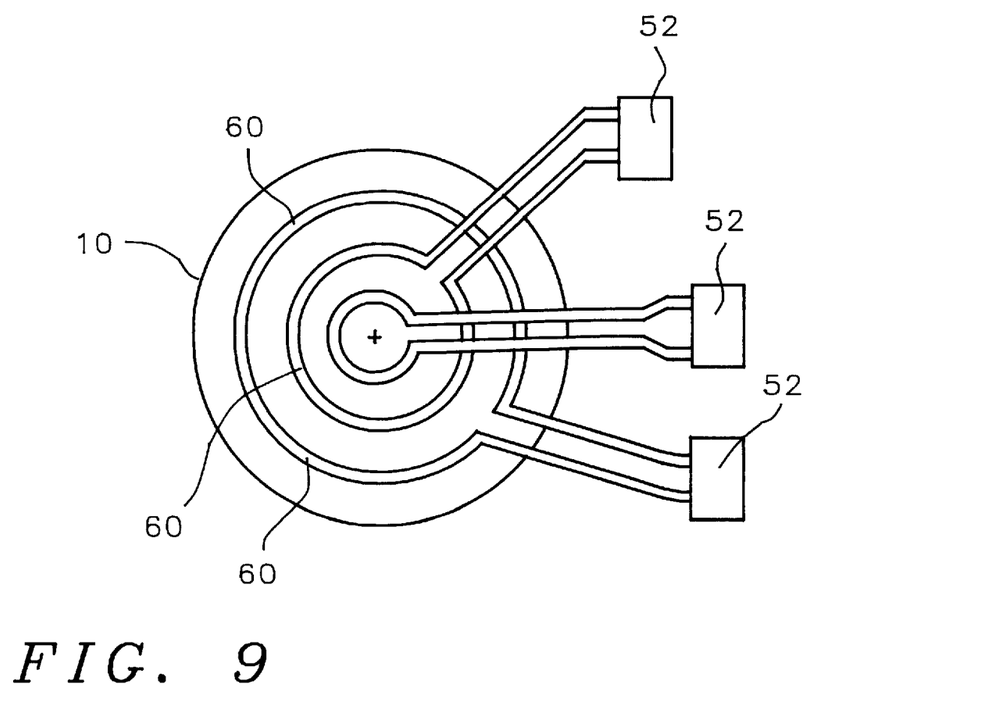
FIG. 9 shows a bottom view of a platen with separate temperature control to the platen circular segments provided by electric power supplied to electrical heating elements or heated or cooled liquid supplied to heating or cooling tubes.

FIG. 9 shows an embodiment of methods and apparatus for adjusting the temperatures of the platen circular segments using circular heating elements 60 in the platen concentric with the center of the platen. FIG. 9 shows a bottom view of the platen showing the concentric heating elements 60 which can be electric heating elements in the platen 10 supplied by independent electrical power sources 52 or tubes in the platen 10 through which heated or cooled liquid from independent sources 52 flows.

Figure 10:
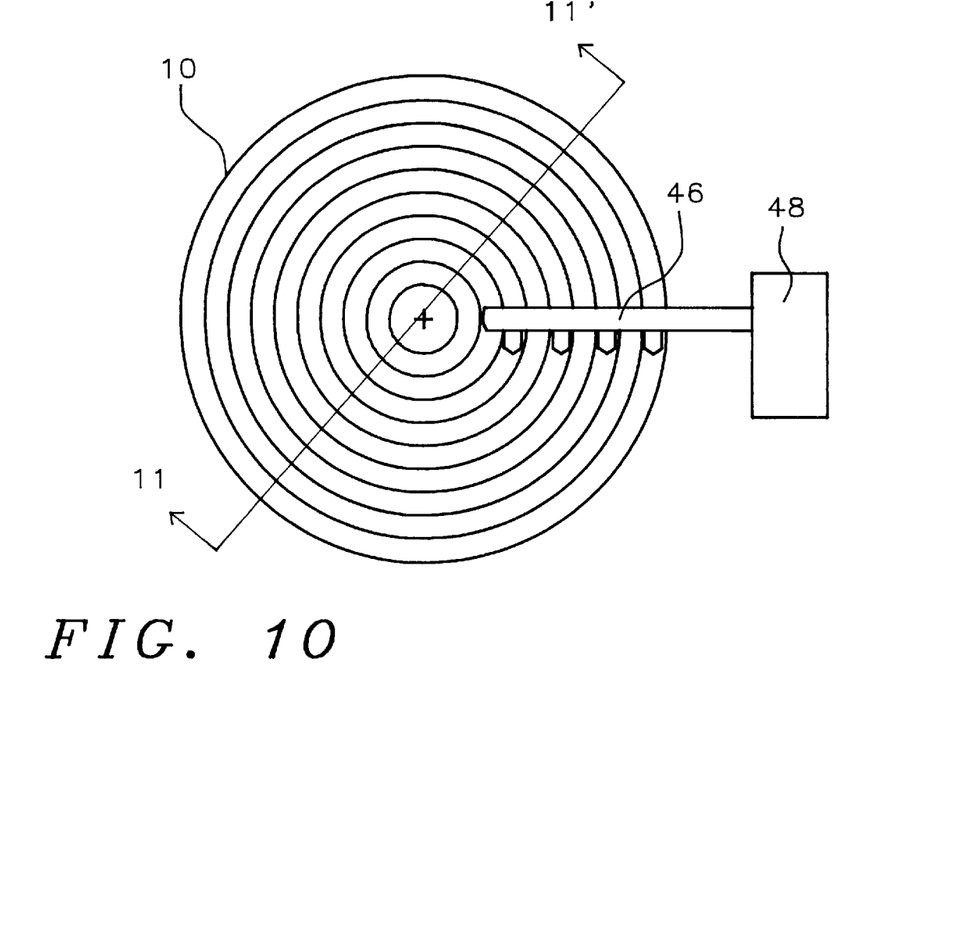
FIG. 10 shows a top view of a platen with separate temperature control to the platen circular segments provided by supplying temperature controlled slurry from separate slurry nozzles to a polishing pad having grooves concentric with the center of the platen.
Figure 11:
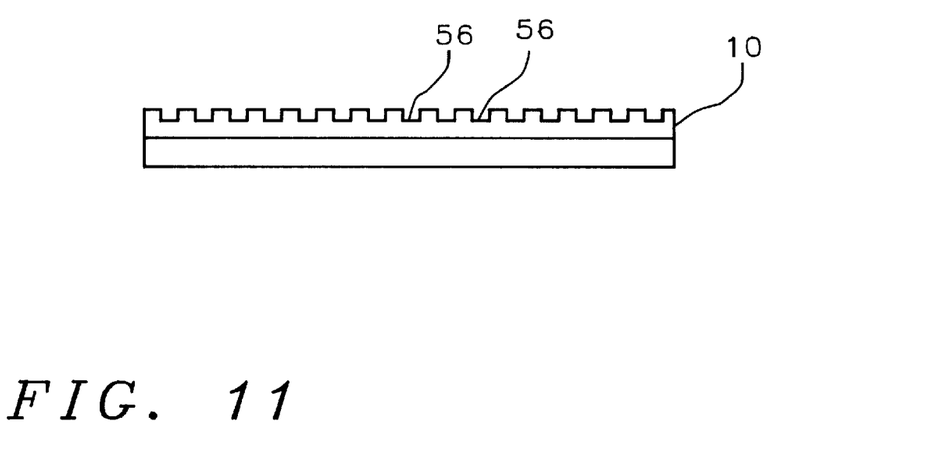
FIG. 11 shows a cross section of the platen and polishing pad of FIG. 5 showing the grooves in the polishing pad.

Another embodiment of methods and apparatus for adjusting the temperatures of the platen circular segments is shown in FIGS. 10 and 11. FIG. 10 shows a top view of the platen showing a polishing pad with small concentric grooves, having a depth of between about 0.01 and 0.02 inches and a width of between about 0.01 and 0.015 inches. FIG. 11 shows a cross section of the platen and polishing pad along the line 11–11' of FIG. 10 showing the grooves in the polishing pad. Polishing slurry is deposited from a slurry source 48 onto the polishing pads using a series of nozzles 46 so that slurry deposited at different distances from the center of the platen can have different temperatures. The grooves in the polishing pad keeps the slurry at the same distance from the center of the platen at which it was deposited so that temperature control of the circular segments of the platen can be accomplished.

While the invention has been particularly shown and described with reference to the preferred embodiments thereof, it will be understood by those skilled in the art that various changes in form and details may be made without departing from the spirit and scope of the invention.

What is claimed is:

1. A method of chemical mechanical polishing, comprising the steps of:

providing a wafer;

providing a platen;

providing a wafer carrier having a center, an outer edge, and a number of carrier circular segments wherein each said carrier circular segment is concentric with said center of said wafer carrier;

providing a polishing pad on said platen;

providing means for varying the temperature of each of said carrier circular segments;

placing said wafer in said wafer carrier;

rotating said platen and said wafer carrier at the same angular velocity;

placing a polishing slurry on said polishing pad;

bringing together said wafer carrier and said platen so that said wafer contacts said polishing slurry and the pressure exerted on said wafer is the least at said center of said wafer carrier, the greatest at said outer edge of said wafer carrier, and increases with increasing distance from said center of said wafer carrier; and adjusting the temperature of each of said carrier circular segments so that the removal rate of material from said wafer is independent of the distance from said center of said wafer carrier.

2. The method of claim 1 wherein said means for varying the temperature of each of said carrier circular segments comprises;

placing an electrical heating element in each of said carrier circular segments; and supplying electrical power to said electrical heating elements wherein the amount of electrical power supplied to said electrical heating element in each said carrier circular segment can be varied independently.

3. The method of claim 1 wherein said means for varying the temperature of each of said carrier circular segments comprises supplying heated or cooled liquid through tubes placed in each of said carrier circular segments.

4. The method of claim 1 wherein said wafer is an integrated circuit wafer.

5. A method of chemical mechanical polishing, comprising the steps of:

providing a platen having a center, an outer edge, and a number of platen circular segments wherein each said platen circular segment is concentric with said center of said platen;

providing a wafer carrier having a center, an outer edge, and a number of carrier circular segments wherein each said carrier circular segment is concentric with said center of said wafer carrier;

providing a polishing pad on said platen;

providing means for varying the temperature of each of said platen circular segments;

providing means for varying the temperature of each of said carrier circular segments;

placing a wafer in said wafer carrier;

rotating said platen at a first angular velocity;

rotating said wafer carrier at a second angular velocity;

placing a polishing slurry on said polishing pad;

bringing together said wafer carrier and said platen so that said wafer contacts said polishing slurry and the pressure exerted on said wafer is the least at said center of said wafer carrier, the greatest at said outer edge of said wafer carrier, and increases with increasing distance from said center of said wafer carrier; and adjusting the temperature of each of said carrier circular segments and each of said platen circular segments so that the removal rate of material from said wafer is independent of the distance from said center of said wafer carrier.

6. The method of claim 5 wherein said means for varying the temperature of each of said carrier circular segments comprises;

placing an electrical heating element in each of said carrier circular segments; and supplying electrical power to said electrical heating elements wherein the amount of electrical power supplied to said electrical heating element in each said carrier circular segment can be varied independently.

7. The method of claim 5 wherein said means for varying the temperature of each of said carrier circular segments comprises supplying heated or cooled liquid through tubes placed in each of said carrier circular segments.

8. The method of claim 5 wherein said means for varying the temperature of each of said platen circular segments comprises;

placing an electrical heating element in each of said platen circular segments; and supplying electrical power to said electrical heating elements wherein the amount of electrical power supplied to said electrical heating element in each said platen circular segment can be varied independently.

9. The method of claim 5 wherein said means for varying the temperature of each of said platen circular segments comprises supplying heated or cooled liquid through tubes placed in each of said platen circular segments.

10. The method of claim 5 wherein said means for varying the temperature of each of said platen circular segments comprises:

forming circular grooves in said polishing pad wherein said circular grooves are concentric with said center of said platen;

providing a number of nozzles placed over said polishing pad wherein each said nozzle is at a different distance from said center of said platen;

placing said polishing slurry on said polishing pad by supplying said polishing slurry through said nozzles wherein the temperature of said slurry supplied through each said nozzle can be varied independently from the temperature of said slurry supplied through every other said nozzle.

11. The method of claim 5 wherein said wafer is an integrated circuit wafer.

12. An apparatus for chemical mechanical polishing, comprising:

a platen which is rotated at a first angular velocity during chemical mechanical polishing wherein said platen has a center, an outer edge, and a number of platen circular segments which are concentric with said center of said platen;

a wafer carrier rotatable at a second angular velocity wherein said wafer carrier has a center, an outer edge, and a number of carrier circular segments which are concentric with said center of said wafer carrier;

a polishing pad attached to said platen;

means for varying the temperature of each of said platen circular segments;

means for varying the temperature of each of said carrier circular segments;

a polishing slurry placed on said polishing pad;

means for bringing together said wafer carrier and said platen so that a wafer held by said wafer carrier contacts said polishing slurry and the pressure exerted on said wafer held by said wafer carrier is the least at said center of said wafer carrier, the greatest at said outer edge of said wafer carrier, and increases with increasing distance from said center of said wafer carrier;

means for adjusting the temperature of each of said carrier circular segments; and means for adjusting the temperature of each of said platen circular segments.

13. The apparatus of claim 12 wherein said means for varying the temperature of each of said carrier circular segments comprises;

an electrical heating element placed in each of said carrier circular segments; and independent electrical power sources connected to said electrical heating elements.

14. The apparatus of claim 12 wherein said means for varying the temperature of each of said carrier circular segments comprises independent sources of heated or cooled liquid connected to tubes placed in each of said carrier circular segments.

15. The apparatus of claim 12 wherein said means for varying the temperature of each of said platen circular segments comprises;

an electrical heating element placed in each of said platen circular segments; and independent electrical power sources connected to said electrical heating elements.

16. The apparatus of claim 12 wherein said means for varying the temperature of each of said platen circular segments comprises independent sources of heated or cooled liquid connected to tubes placed in each of said platen circular segments.

17. The apparatus of claim 12 wherein said means for varying the temperature of each of said platen circular segments comprises:

circular grooves formed in said polishing pad wherein said circular grooves are concentric with said center of said platen;

a number of nozzles placed over said polishing pad wherein each said nozzle is at a different distance from said center of said platen; and a source of polishing slurry connected to said nozzles so that the temperature of said slurry supplied through each said nozzle can be varied independently from the temperature of said slurry supplied through every other said nozzle.

* * * * *